United States Patent
Yeung et al.

(10) Patent No.: US 10,985,273 B2
(45) Date of Patent: Apr. 20, 2021

(54) VERTICAL FIELD-EFFECT TRANSISTOR INCLUDING A FIN HAVING SIDEWALLS WITH A TAPERED BOTTOM PROFILE

(71) Applicant: International Business Machines Corporation, Armonk, NY (US)

(72) Inventors: Chun Wing Yeung, Niskayuna, NY (US); ChoongHyun Lee, Rensselaer, NY (US); Jingyun Zhang, Albany, NY (US); Robin Hsin Kuo Chao, Cohoes, NY (US); Heng Wu, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/589,614

(22) Filed: Oct. 1, 2019

(65) Prior Publication Data
US 2020/0027984 A1 Jan. 23, 2020

Related U.S. Application Data

(62) Division of application No. 15/955,822, filed on Apr. 18, 2018, now Pat. No. 10,529,850.

(51) Int. Cl.
*H01L 29/78* (2006.01)
*H01L 21/8234* (2006.01)
*H01L 29/06* (2006.01)
*H01L 29/08* (2006.01)

(52) U.S. Cl.
CPC .. *H01L 29/7827* (2013.01); *H01L 21/823487* (2013.01); *H01L 29/0649* (2013.01); *H01L 29/0847* (2013.01)

(58) Field of Classification Search
None
See application file for complete search history.

(56) References Cited

U.S. PATENT DOCUMENTS

| | | | |
|---|---|---|---|
| 8,415,209 B2* | 4/2013 | Rooyackers | H01L 29/7391 438/149 |
| 9,018,084 B2 | 4/2015 | Chang et al. | |
| 9,178,064 B2* | 11/2015 | Sudo | H01L 29/66818 |

(Continued)

OTHER PUBLICATIONS

V.D. Kunz et al., "Reduction of Parasitic Capacitance in Vertical MOSFETs by Spacer Local Oxidation," IEEE Transactions on Electron Devices, Jun. 2003, pp. 1487-1493, vol. 50, No. 6.

(Continued)

*Primary Examiner* — Telly D Green
(74) *Attorney, Agent, or Firm* — Douglas Pearson; Ryan, Mason & Lewis, LLP

(57) ABSTRACT

A method of forming a semiconductor structure includes forming at least one fin disposed over a substrate, wherein sidewalls of the at least one fin includes a first portion proximate a top surface of the substrate having a tapered profile and a second portion disposed above the first portion. The method also includes forming a bottom source/drain region surrounding at least part of the first portion of the sidewalls of the at least one fin having the tapered profile and forming a bottom spacer disposed over a top surface of the bottom source/drain region surrounding at least part of the second portion of the sidewalls of the at least one fin. The at least one fin provides a channel for a vertical field-effect transistor.

20 Claims, 11 Drawing Sheets

(56) References Cited

U.S. PATENT DOCUMENTS

| | | |
|---|---|---|
| 9,530,700 B1 | 12/2016 | Mallela et al. |
| 9,553,194 B1 | 1/2017 | Licausi et al. |
| 9,627,511 B1 | 4/2017 | Cheng et al. |
| 9,680,473 B1 | 6/2017 | Anderson et al. |
| 9,711,618 B1 | 7/2017 | Cheng et al. |
| 9,755,073 B1 | 9/2017 | Cheng et al. |
| 9,773,901 B1 | 9/2017 | Gluschenkov et al. |
| 9,780,208 B1 * | 10/2017 | Xie ................. H01L 21/324 |
| 9,837,405 B1 | 12/2017 | Cheng et al. |
| 9,893,169 B1 | 2/2018 | Cheng et al. |
| 9,929,152 B2 * | 3/2018 | Anderson ............. H01L 27/088 |
| 10,134,893 B2 * | 11/2018 | Anderson ........... H01L 29/7827 |
| 2001/0017392 A1 | 8/2001 | Comfort et al. |
| 2007/0228496 A1 | 10/2007 | Rochefort et al. |
| 2011/0253981 A1 * | 10/2011 | Rooyackers ........... B82Y 10/00 257/24 |
| 2013/0221448 A1 | 8/2013 | Chang et al. |
| 2013/0230953 A1 * | 9/2013 | Sudo ................... H01L 29/785 438/268 |
| 2014/0299923 A1 | 10/2014 | Chang |
| 2015/0076654 A1 | 3/2015 | Ganz et al. |
| 2015/0170916 A1 | 6/2015 | Yu et al. |
| 2016/0155670 A1 | 6/2016 | Liaw |
| 2016/0225659 A1 * | 8/2016 | Jacob ................. H01L 21/26506 |
| 2016/0225675 A1 | 8/2016 | Shen et al. |
| 2016/0273666 A1 | 9/2016 | Goldsmith |
| 2017/0092544 A1 | 3/2017 | Cheng et al. |
| 2017/0207338 A1 | 7/2017 | Chiu et al. |
| 2017/0229351 A1 | 8/2017 | Fung |
| 2017/0317210 A1 * | 11/2017 | Anderson ....... H01L 21/823437 |
| 2018/0006024 A1 * | 1/2018 | Anderson ......... H01L 29/66666 |
| 2018/0040716 A1 | 2/2018 | Cheng et al. |
| 2018/0069097 A1 | 3/2018 | Cheng et al. |
| 2018/0240907 A1 * | 8/2018 | Anderson ........... H01L 29/0653 |
| 2018/0247938 A1 | 8/2018 | Cheng et al. |
| 2019/0027599 A1 | 1/2019 | Anderson et al. |

OTHER PUBLICATIONS

List of IBM Patents or Patent Applications Treated as Related.

* cited by examiner

200

100

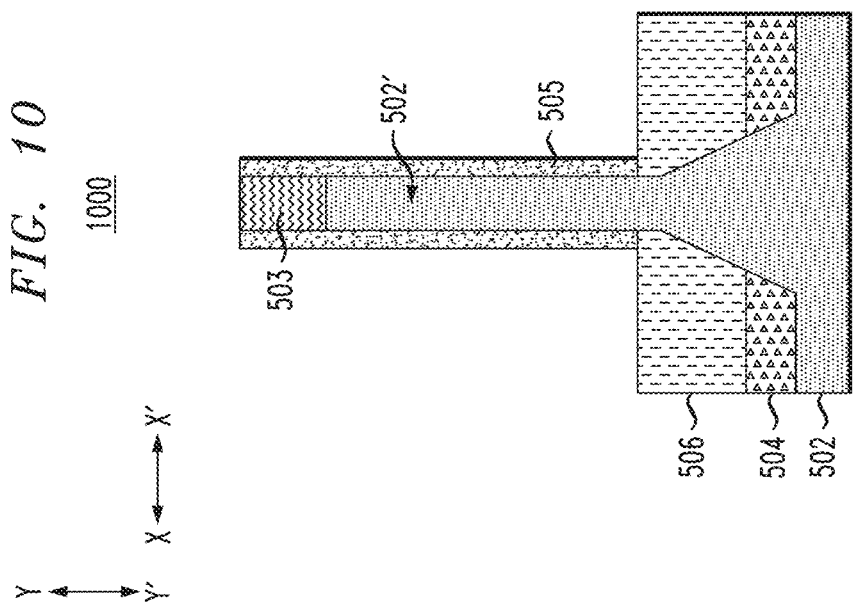
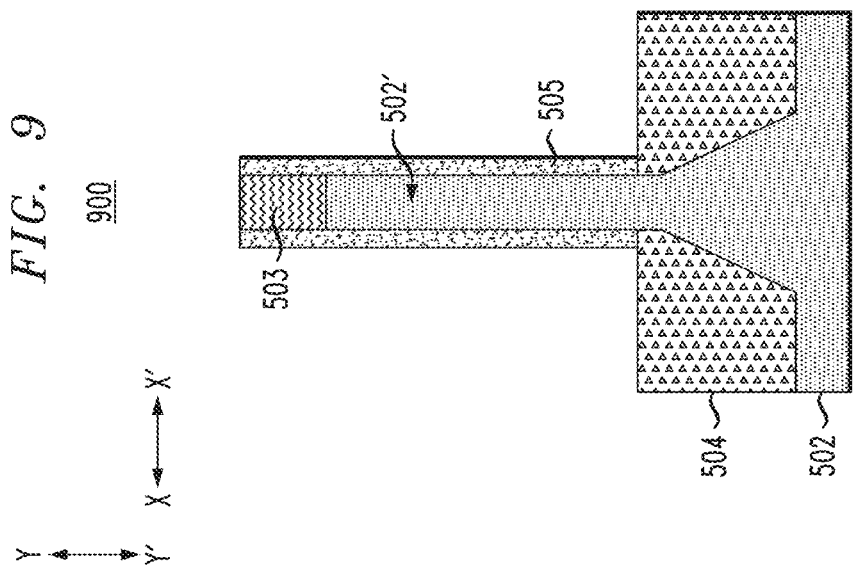

1400

1300

1800

1700

2000

1900 for continued scaling of complementary metal-oxide-semiconductor (CMOS) devices.
VERTICAL FIELD-EFFECT TRANSISTOR INCLUDING A FIN HAVING SIDEWALLS WITH A TAPERED BOTTOM PROFILE

BACKGROUND

The present application relates to semiconductors, and more specifically, to techniques for forming vertical field-effect transistor semiconductor structures. Fin field-effect transistor (FinFET) devices include a transistor architecture that use fins as channel regions. FinFET devices may include fins with source/drain regions on lateral sides of the fins, so that current flows in a horizontal direction (e.g., parallel to a substrate) between source/drain regions at opposite ends of the fins in the horizontal direction. Vertical transport field-effect transistor (vertical FET or VFET) devices include source/drain regions at ends of the fins on top and bottom sides of the fins, so that current flows in a vertical direction (e.g., perpendicular to the substrate) from a bottom source/drain region to a top source/drain region. Vertical FET devices address limitations in scaling of horizontal FET devices, such as by decoupling gate length from contact gate pitch. Therefore, vertical FET devices are viable options for continued scaling of complementary metal-oxide-semiconductor (CMOS) devices.

SUMMARY

Embodiments of the invention provide techniques for forming vertical field-effect transistor semiconductor structures with reduced variability in bottom source/drain regions and gate length resulting from fin tapering.

In one embodiment, a method of forming a semiconductor structure comprises forming at least one fin disposed over a substrate, wherein sidewalls of the at least one fin comprises a first portion proximate a top surface of the substrate having a tapered profile and a second portion disposed above the first portion. The method also comprises forming a bottom source/drain region surrounding at least part of the first portion of the sidewalls of the at least one fin having the tapered profile and forming a bottom spacer disposed over a top surface of the bottom source/drain region surrounding at least part of the second portion of the sidewalls of the at least one fin. The at least one fin comprises a channel for a vertical field-effect transistor.

In another embodiment, a semiconductor structure comprises a substrate, at least one fin disposed on a top surface of the substrate, wherein sidewalls of the at least one fin comprises a first portion proximate a top surface of the substrate having a tapered profile and a second portion disposed above the first portion, a bottom source/drain region surrounding at least part of the first portion of the sidewalls of the at least one fin having the tapered profile, and a bottom spacer disposed over a top surface of the bottom source/drain region surrounding at least part of the second portion of the sidewalls of the at least one fin. The at least one fin comprises a channel for a vertical field-effect transistor.

In another embodiment, an integrated circuit comprises a vertical field-effect transistor comprising a substrate, at least one fin disposed on a top surface of the substrate, wherein sidewalls of the at least one fin comprises a first portion proximate a top surface of the substrate having a tapered profile and a second portion disposed above the first portion, a bottom source/drain region surrounding at least part of the first portion of the sidewalls of the at least one fin having the tapered profile, and a bottom spacer disposed over a top surface of the bottom source/drain region surrounding at least part of the second portion of the sidewalls of the at least one fin. The at least one fin provides a channel for the vertical field-effect transistor.

BRIEF DESCRIPTION OF THE DRAWINGS

FIG. 9 depicts a side cross-sectional view of the FIG. 8 structure following etching of the spacer, according to an embodiment of the present invention.

FIG. 10 depicts a side cross-sectional view of the FIG. 9 structure following etching of the oxide an epitaxial growth of bottom source/drain regions, according to an embodiment of the present invention.

DETAILED DESCRIPTION

Illustrative embodiments of the invention may be described herein in the context of illustrative methods for forming vertical field-effect transistors with reduced variability in bottom source/drain regions and gate lengths resulting from fin tapering, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

Figure 1:
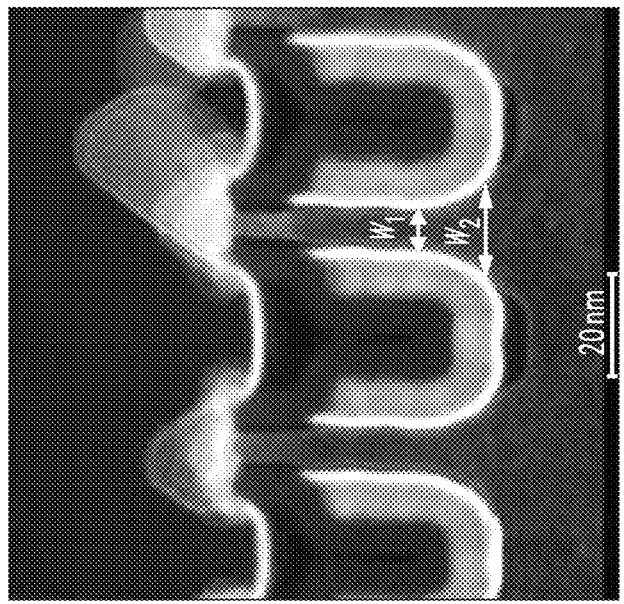
FIG. 1 depicts an image of a vertical field-effect transistor structure with fins having tapered bottom portions, according to an embodiment of the present invention.

As described above, vertical field-effect transistor (vertical FET or VFET) devices may be formed using fins. The fin may be formed by etching a substrate, with the resulting fin having a tapered bottom portion. FIG. 1 shows an image 100 of a vertical FET structure having a number of fins with tapered bottom portions. By tapered bottom portions, it is meant that the fin thickness increases towards a bottom portion of the fin proximate the substrate. This is illustrated in image 100 by the fin widths $w_1$ and $w_2$, where $w_2 > w_1$. Tapering the bottom portion of the fins may provide various advantages, such as in lowering extension resistance. Uncontrolled fin tapering profiles, however, may be detrimental to device performance and uniformity. The fin width or "Dfin" at the bottom source side junction may be hard to control, which may degrade electrostatics. In addition, diffusion of a bottom source/drain dopant is affected by the fin profile, and any fin height and profile variation created by fin reactive-ion etching (RIE) adds variability to the bottom junction formation.

Figure 2:
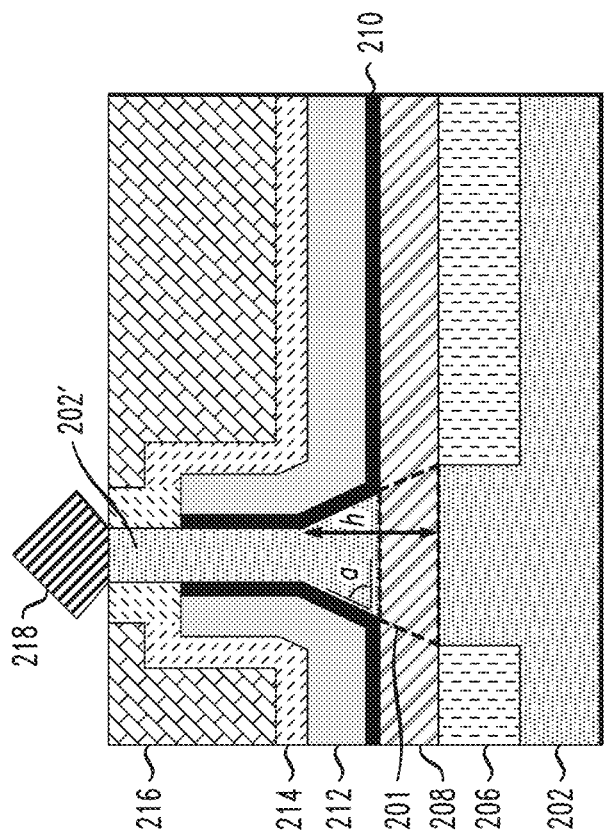
FIG. 2 depicts a side cross-sectional view of a vertical field-effect transistor structure with a fin having tapered bottom portions, according to an embodiment of the present invention.

FIG. 2 shows a side cross-sectional view 200 of a vertical FET structure having a fin with a tapered bottom portion. The FIG. 2 structure includes a substrate 202, over which a fin 202' is formed, with the fin 202' having a tapered bottom portion defined by a tapering angle a and a tapering height h as illustrated. A bottom source/drain region 206 is formed over a top surface of the substrate 202 surrounding the fin 202'. A spacer 208 is formed over the bottom source/drain region 206. The spacer 208 surrounds or wraps around the fin 202'. FIG. 2 shows that the fin 202' is "behind" the spacer 208 in the region of dashed outline 201.

A dielectric layer 210, also referred to herein as a high-k (HK) dielectric or gate dielectric, is formed over the spacer 208 and surrounding the fin 202'. A gate work function metal (WFM) layer 212 surrounds the gate dielectric 210. Gate encapsulation dielectric layer 214 surrounds the gate WFM layer 212. An insulator or oxide layer 216 is formed surrounding the gate encapsulation dielectric layer 214. Top source/drain region 218 is formed over a top of the fin 202'.

Embodiments provide methods for forming vertical FET devices that reduce the variability of the bottom source/drain and gate regions caused by fin tapering. As a result, the fin taper profile near a bottom of the fin will have less effect on the bottom junction and gate formation. In some embodiments, the bottom source/drain region is isolated by an oxide to reduce junction leakage.

Figure 3:
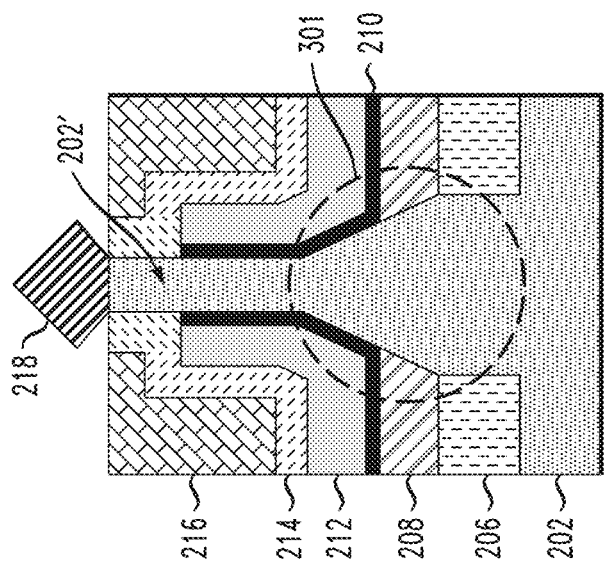
FIG. 3 depicts a side cross-sectional view of a vertical field-effect transistor structure with a fin having tapered bottom portions, according to an embodiment of the present invention.

FIG. 3 shows a side cross-sectional view 300 of the semiconductor structure of FIG. 2, highlighting the tapered portion 301 of the fin 202'. In addition, the side cross-sectional view 300 is taken such that the fin profile is visible "behind" the spacer 208 which surrounds the fin 202'.

Figure 4:
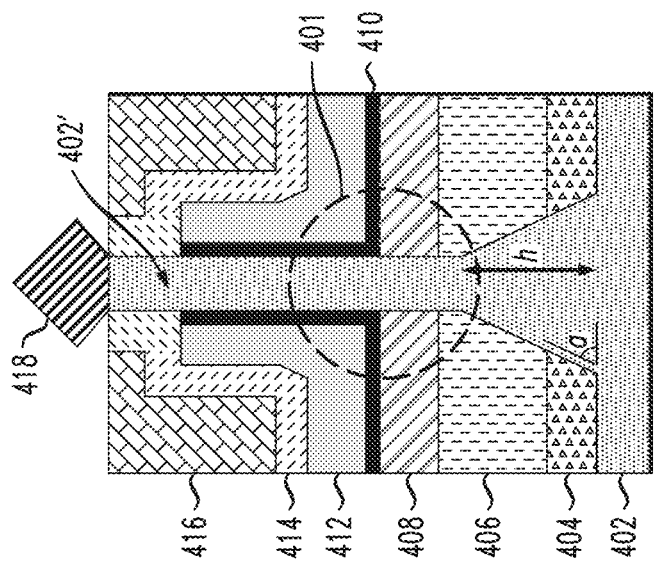
FIG. 4 depicts a side cross-sectional view of a vertical field-effect transistor with a fin having tapered bottom portions surrounded by an oxide, according to an embodiment of the present invention.

FIG. 4 shows a side cross-sectional view 400 of a vertical FET structure having a bottom junction that is immune to the above-noted issues with fin tapering. The FIG. 4 vertical FET structure includes a substrate 402. A fin 402' is formed from the substrate 402, with the fin 402' having a tapered bottom portion as illustrated.

The substrate 402 may be formed of bulk silicon (Si) or another suitable material. The substrate 402 may have a vertical thickness (in direction Y-Y') ranging from 500 to 1000 micrometers (μm). The fin 402' may have a horizontal thickness (in direction X-X') in a non-tapered region thereof ranging from 50 to 100 nanometers (nm). The fin 402' may have a height (in direction Y-Y'), measured from a top surface of the substrate 402, ranging from 50 to 100 nm. The taper of the fin 402' may include a tapering angle a in the range of 30 to 85°, and a tapering height h in the range of 10 to 30 nm.

An oxide layer 404 is formed over a top surface of the substrate 402, surrounding at least a portion of the tapered profile of the fin 402'. The oxide layer 404 may be formed of any suitable oxide material such as silicon dioxide ($SiO_2$). The oxide layer 404 may have a vertical thickness (in direction Y-Y') which is less than that of the fin tapering height h. In some embodiments, such as that shown in FIG. 4, the vertical thickness (in direction Y-Y') of the oxide layer 404 is less than the fin tapering height h, such as in the range of 5 to 25 nm.

Bottom source/drain region 406 is formed over the oxide layer 404 surrounding the fin 402'. The bottom source drain region 406 may comprise doped Si or another suitable material such as doped silicon germanium (SiGe). The bottom source/drain region 406 may have a vertical thickness (in direction Y-Y') ranging from 10 to 50 nm. As highlighted by region 401, the bottom source/drain region 406 primarily surrounds a portion of the fin 402' having a uniform fin width (e.g., the bottom source/drain region 406 surrounds the fin 402' above the tapered portion thereof).

Bottom spacer 408 is formed over the bottom source/drain region 406. The bottom spacer 408 may be formed of silicon nitride (SiN), $SiO_2$ or another suitable material. The bottom spacer 408 may have a vertical thickness (in direction Y-Y') ranging from 5 to 15 nm.

A dielectric layer 410 is formed over the bottom spacer 408 and surrounding a portion of the sidewalls of the fin 402'. The dielectric layer 410 may be a HK dielectric such as hafnium oxide ($HfO_2$), although other suitable materials may be used. The dielectric layer 410 may have a substantially uniform thickness in the range of 5 to 50 angstroms (Å). The dielectric layer 410 is formed, as shown, surrounding a portion of the sidewalls of the fin 402' above the bottom spacer 408. The height of the sidewalls of the fin 402' covered by the dielectric layer 410 may range from 10 to 50 nm.

Gate conductor or gate WFM layer 412 is formed over the gate dielectric layer 410 surrounding the fin 402' as shown. The gate WFM layer 412 may be formed of titanium nitride (TiN) or another suitable WFM material. The layer 412 may have a thickness ranging from 3 to 15 nm.

Gate encapsulation layer 414 is formed over the gate WFM layer 412. The gate encapsulation layer 414 may be formed of a dielectric material such as SiN, silicon boron carbide nitride (SiBCN) or another suitable low-k dielectric. The gate encapsulation layer 414 has a uniform thickness ranging from 5 to 15 nm. The gate encapsulation layer 414, as shown in FIG. 4, surrounds the sidewalls of the fin 402' above the gate dielectric layer 410 and gate WFM layer 412. An oxide or insulator layer 416 is formed surrounding the gate encapsulation layer 414.

Top source/drain region 418 is formed over a top surface of the fin 402' as illustrated. The top source/drain region 418 may be formed of doped Si, doped SiGe or another suitable material. The top source drain region 418 may have a maximum vertical thickness (in direction Y-Y') ranging from 5 to 50 nm, and a maximum horizontal thickness (in direction X-X') ranging from 10 to 50 nm.

Figure 5:
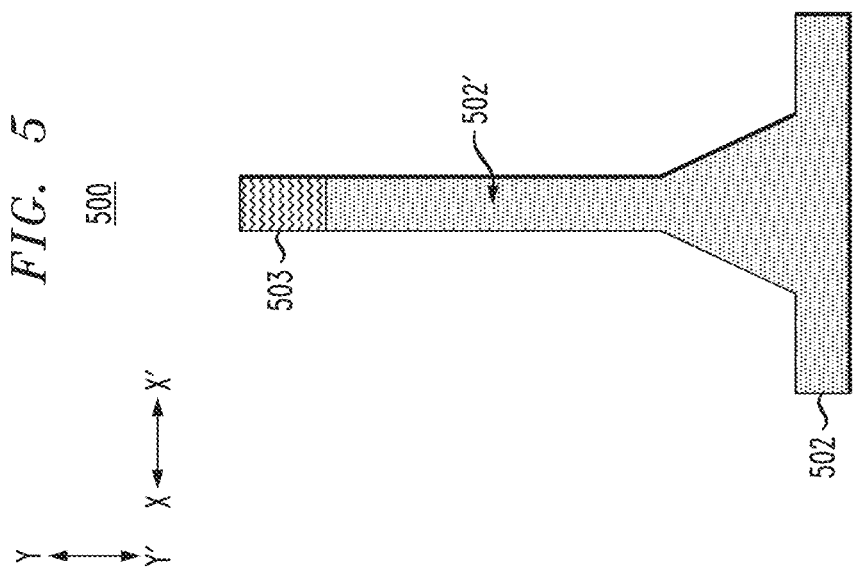
FIG. 5 depicts a side cross-sectional view of a substrate having a fin with tapered bottom portions formed therein, according to an embodiment of the present invention.

A method for forming the semiconductor structure of FIG. 4 will now be described with respect to FIGS. 5-10. FIG. 5 shows a side cross-sectional view 500 of a semiconductor structure including fin 502' formed by etching a substrate 502 as illustrated. The substrate 502 and fin 502' may be formed of similar materials and with similar dimensions as that of substrate 402 and fin 402' described above.

A hard mask layer 503 is formed over a top surface of the fin 502'. The hard mask layer 503 may be formed of SiN, $SiO_2$, combinations thereof, or another suitable material. The hard mask layer 503 may have a vertical thickness (in direction Y-Y') ranging from 30 to 70 nm. The hard mask 503 may be patterned over the substrate 502, with exposed portions of the substrate 502 being etched to form the fin 502' shown in FIG. 5.

Figure 6:
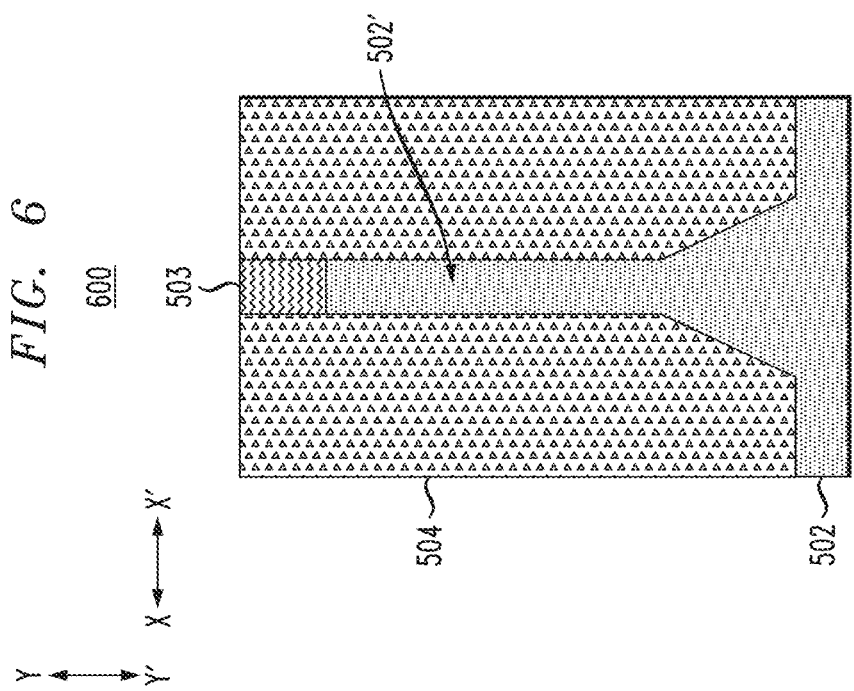
FIG. 6 depicts a side cross-sectional view of the FIG. 5 structure following fill with an oxide, according to an embodiment of the present invention.

FIG. 6 shows a side cross-sectional view 600 of the FIG. 5 structure following fill with and planarization of an oxide 504. The oxide 504 may be formed of similar materials as oxide 404 described above.

Figure 7:
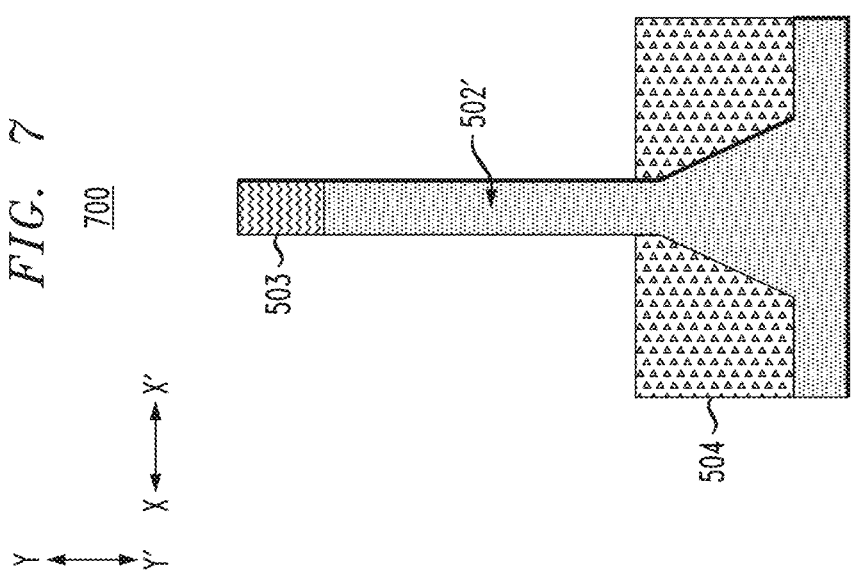
FIG. 7 depicts a side cross-sectional view of the FIG. 6 structure following reveal of the fin by recessing the oxide, according to an embodiment of the present invention.

FIG. 7 shows a side cross-sectional view 700 of the FIG. 6 structure following a fin reveal by recessing the oxide 504. The recess of the oxide 504 has some tolerance, meaning that the top surface of the recessed oxide 504 may be slightly above (e.g., 0 to 10 nm) the top of the tapered region of the fin 502' as illustrated in FIG. 7. If the oxide 504 is not recessed enough (e.g., such that no part of the tapered profile of the fin 502' is "revealed"), then there may not be sufficient space for the gate height.

Figure 8:
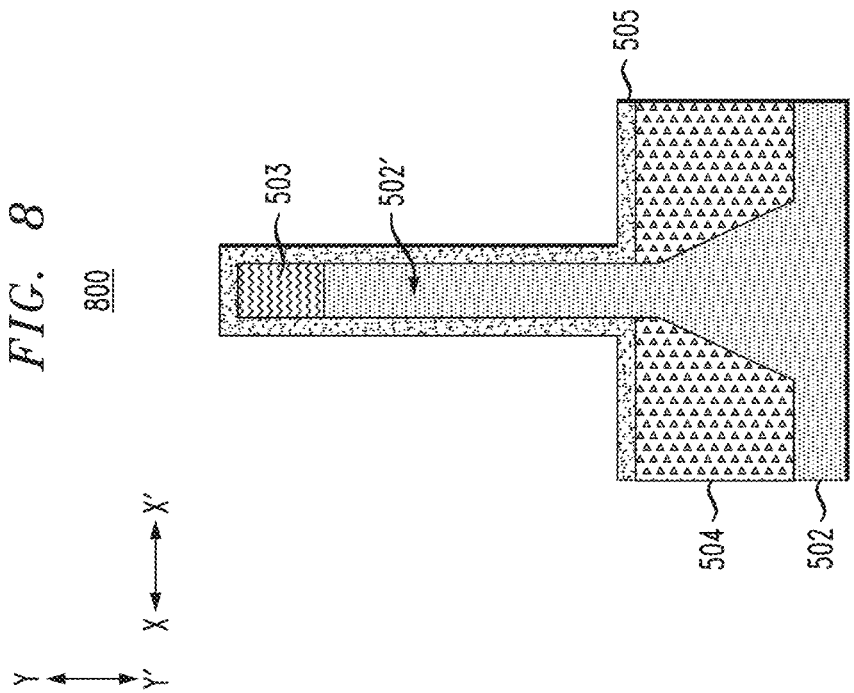
FIG. 8 depicts a side cross-sectional view of the FIG. 7 structure following deposition of a spacer over the oxide and the fin, according to an embodiment of the present invention.

FIG. 8 shows a side cross-sectional view 800 of the FIG. 7 structure following deposition of a spacer 505 over the oxide 504 and surrounding the fin 502' and hard mask layer 503. The spacer 505 may be formed of a nitride, oxide or other suitable material. The spacer 505 may have a uniform thickness in the range of 3-10 nm.

FIG. 9 shows a side cross-sectional view 900 of the FIG. 8 structure following etching of the spacer 505. The etching of spacer 505 is a directional or anisotropic etch, such that only the spacer 505 formed on sidewalls of the fin 502' and hard mask layer 503 remain (e.g., the spacer formed over the top of the hard mask layer 503 and on top of the oxide 504 is removed as illustrated).

FIG. 10 shows a side cross-sectional view 1000 of the FIG. 9 structure following etching of the oxide 504 and epitaxial growth of bottom source/drain region 506 over the oxide 504. The bottom source/drain region 506 may be formed of similar materials and with similar sizing as that of bottom source/drain region 406 described above.

The structure of FIG. 10 may be subject to further processing to result in the FIG. 4 structure. For example, the spacer 505 is stripped, and the bottom spacer (408) is deposited. The HK dielectric layer (410) is formed, followed by formation of the gate conductor layer (412), gate encapsulation layer (414). An oxide or insulator (416) is formed over the gate conductor and gate encapsulations layers, and then planarized/recessed to match a top height of the fin 502'. The hard mask layer 503 is removed, and a top source/drain region (418) is epitaxially grown over the exposed top surface of the fin 502'.

Figure 12:
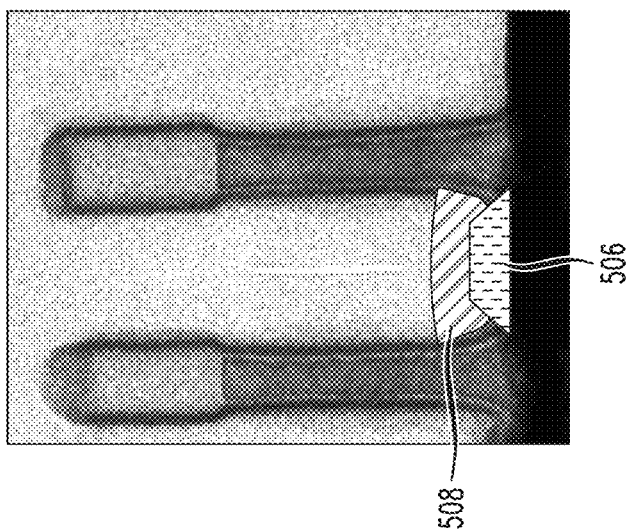
FIG. 12 depicts the FIG. 11 image following epitaxial growth of a bottom source/drain region and formation of a bottom spacer over the bottom source/drain region, according to an embodiment of the present invention.
Figure 11:
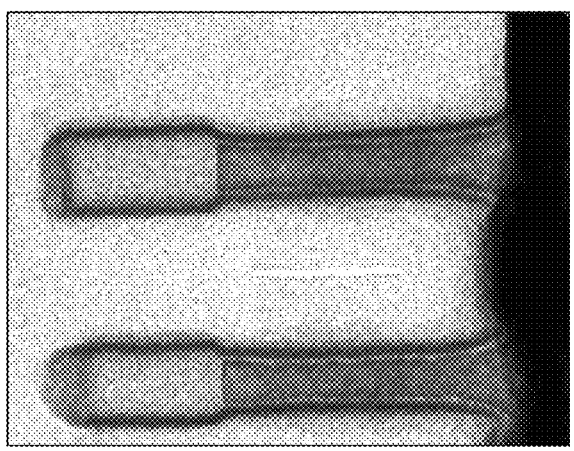
FIG. 11 depicts an image of fins having tapered bottom portions, according to an embodiment of the present invention.
Figure 14:
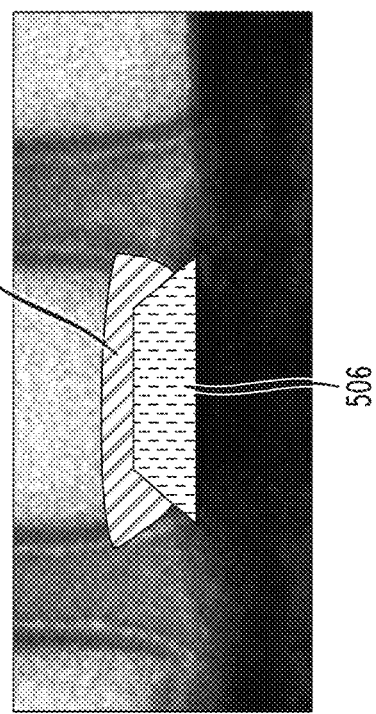
FIG. 14 depicts a zoomed-in view of the tapered bottom portion of the fins in the FIG. 12 image, according to an embodiment of the present invention.
Figure 13:
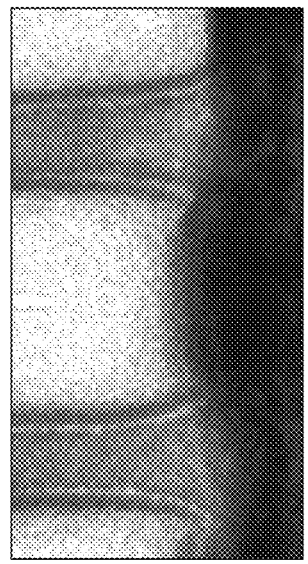
FIG. 13 depicts a zoomed-in view of the tapered bottom portion of the fins in the FIG. 11 image, according to an embodiment of the present invention.

FIG. 11 shows an image 1100 of fins having tapered bottom portions. FIG. 12 shows an image 1200 of the FIG. 11 structure following formation of the bottom source/drain region 506 and a bottom spacer 508 over the bottom source/drain region 506. FIGS. 13 and 14 illustrate zoomed-in images 1300 and 1400, respectively, of the structures shown in FIGS. 11 and 12.

Figure 15A:
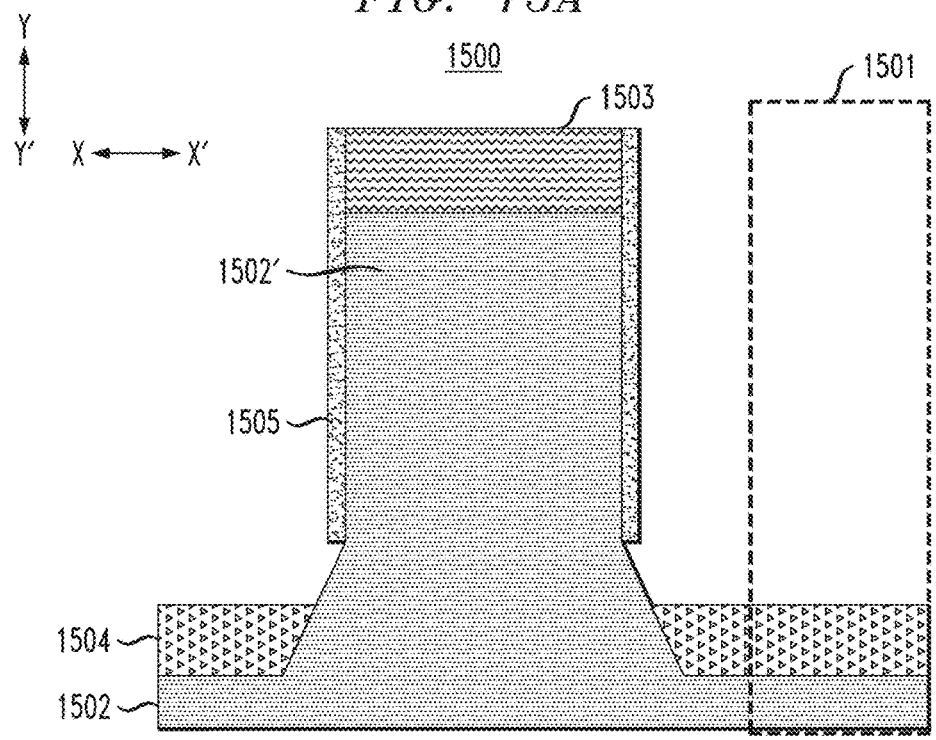
FIG. 15A depicts a side cross-sectional view of a substrate with a fin having a tapered bottom portion along with an additional mask for formation of a contact to a bottom source/drain region, according to an embodiment of the present invention.

FIG. 15A shows a side cross-sectional view 1500 of a semiconductor structure including a fin 1502' formed over a substrate 1502, the fin 1502' having a bottom portion with a tapered profile as described herein. The substrate 1502 and fin 1502' may be formed with similar materials and similar sizing as that of the substrate 402 and fin 402' described above. The structure also includes an oxide 1504 similar to the oxide 404, and a hard mask layer 1503 and spacer 1505 similar to that that of hard mask layer 503 and spacer 505, respectively.

Figure 15B:
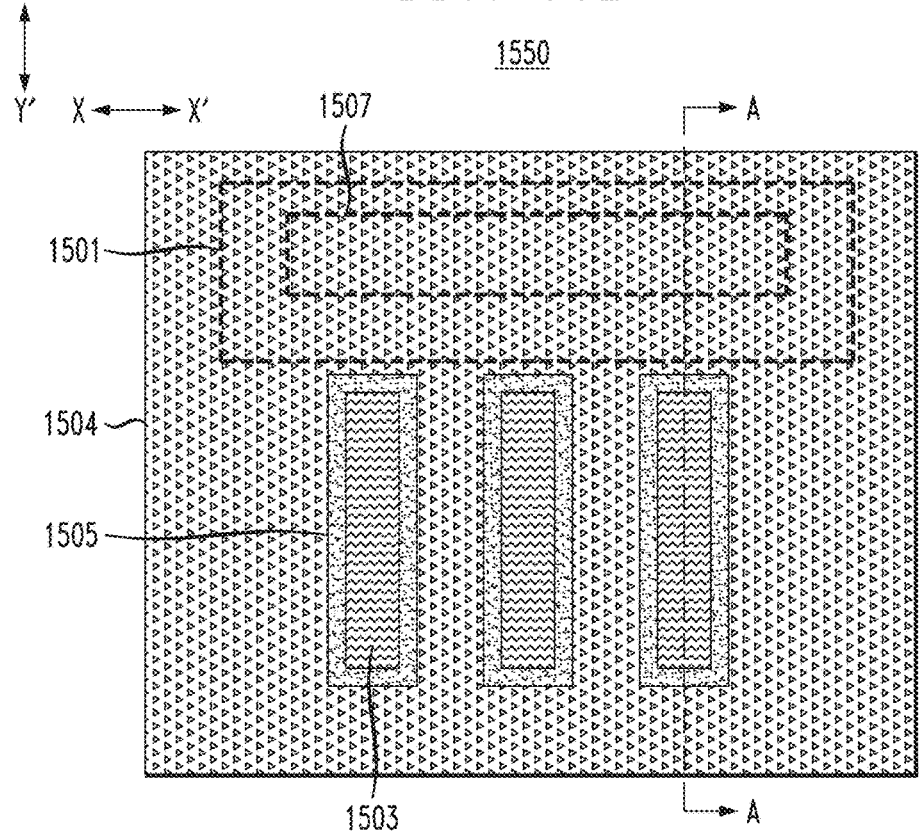
FIG. 15B depicts a top-down view of the FIG. 15A structure, according to an embodiment of the present invention.

The side cross-sectional view 1500 of FIG. 15A is taken length-wise along the fin (e.g., along the line A-A shown in the top-down view 1550 of FIG. 15B. The side cross-sectional views of FIGS. 2-10 (and of FIGS. 17-19 described below) are taken perpendicular to the length of the fin.

In some embodiments, the vertical FET structures are formed using a scheme that relies on epitaxial lateral growth for the bottom source/drain contact, such that a self-aligned contact scheme such as i-RX or inverse RX (active region) is an option for the bottom source/drain region contact. For i-RX, instead of opening the bottom source/drain contact "far" from the active region edge, an inverse RX mark for the bottom source/drain contact is aligned to the edge of the active region so long as there is a self-aligned contact (SAC) capping layer formed above the top source/drain region to provide etch selectivity.

The top-down view 1550 of FIG. 15B shows a region where the contact 1507 for the bottom source/drain region will land (or be formed) during middle of line (MOL) processing. Both FIGS. 15A and 15B illustrate an additional mask region 1501, formed to have an additional shallow trench isolation (STI) recess in the bottom source/drain contact regions so that that the bottom source/drain contact will contact the bottom source/drain epitaxial layers.

Figure 16A:
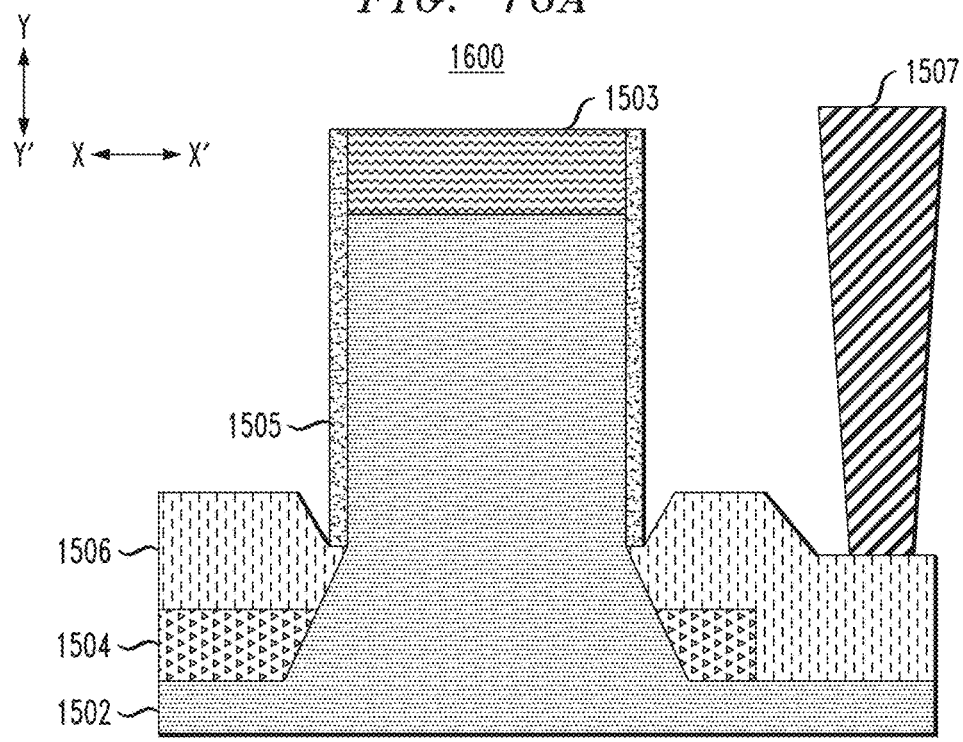
FIG. 16A depicts a side cross-sectional view of the FIG. 15A structure following formation of a bottom source/drain region and a contact to the bottom source/drain region, according to an embodiment of the present invention.
Figure 16B:
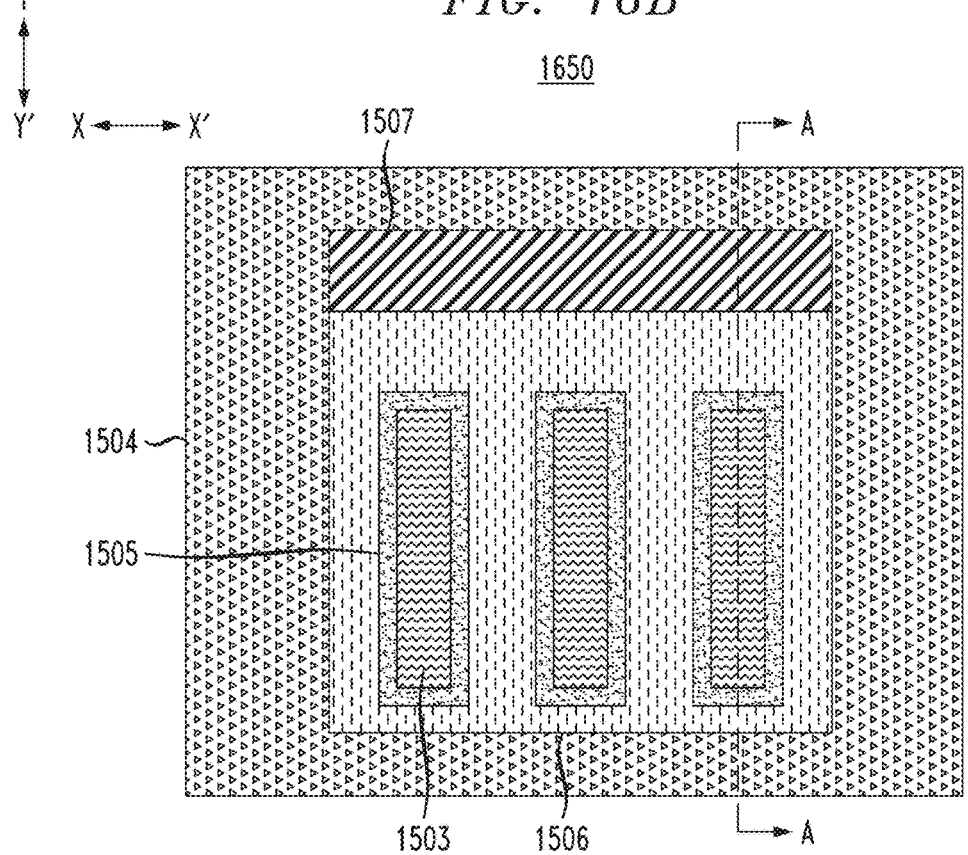
FIG. 16B depicts a top-down view of the FIG. 16A structure, according to an embodiment of the present invention.

FIG. 16A shows a side cross-sectional view 1600 of the FIG. 15 structure following removal of the oxide 1504 in the mask region 1501, and formation of the bottom source/drain region 1506 as illustrated. FIG. 16B shows a top-down view 1650 of the FIG. 15 structure following such processing. The side cross-sectional view 1600 of FIG. 16A is taken along the line A-A in the top-down view 1650 of FIG. 16B. FIGS. 16A and 16B also show where the contact for the bottom source/drain region 1506 will be formed during later processing, illustrating the bottom source/drain contact 1507 in dashed outline with different shading for clarity.

Figure 18:
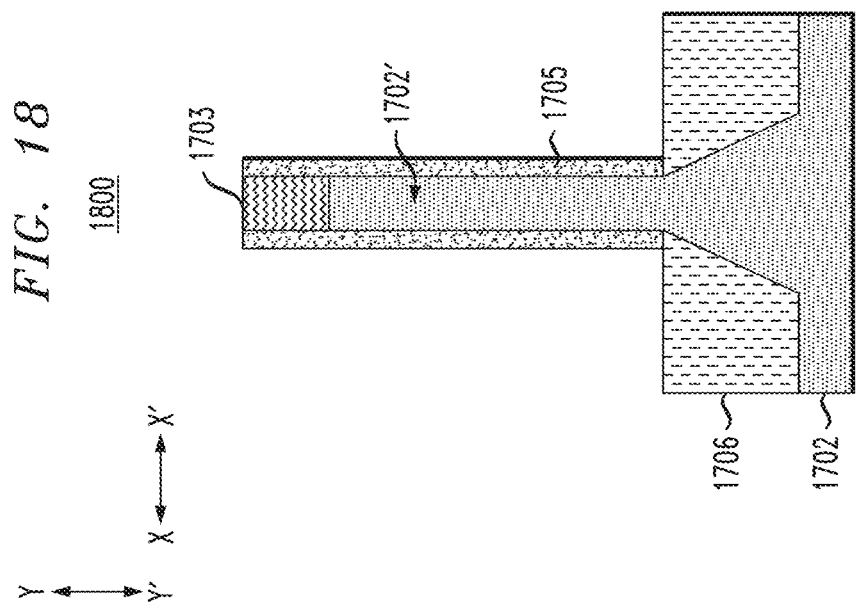
FIG. 18 depicts a side cross-sectional view of the FIG. 17 structure following formation of a spacer and epitaxial growth of bottom source/drain regions, according to an embodiment of the present invention.
Figure 17:
FIG. 17 depicts a side cross-sectional view of a substrate having a fin with tapered bottom portions formed therein, according to an embodiment of the present invention.
Figure 19:
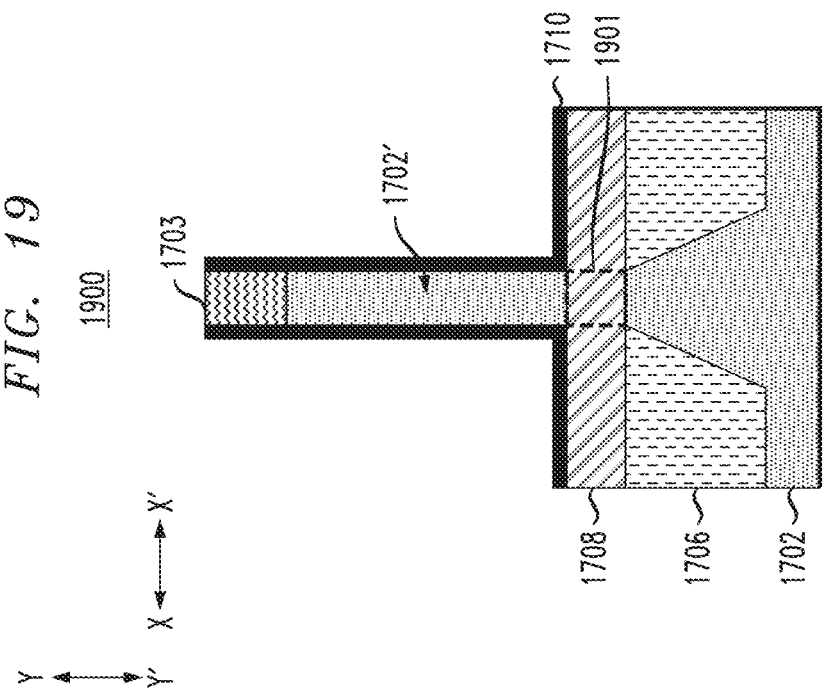
FIG. 19 depicts a side cross-sectional view of the FIG. 18 structure following formation of a bottom spacer and a dielectric layer, according to an embodiment of the present invention.

FIGS. 17-19 illustrate another example of processing for forming a vertical FET structure such that the fin taper profile near the bottom of the fin has less effect on the bottom junction and gate formation. In the processing described below with respect to FIGS. 17-19, there is combined fin RIE and bottom source/drain RIE in one step, as compared to a process where fin RIE is followed by spacer formation, bottom source/drain RIE and source/drain epitaxial growth. Anisotropic spacer RIE, which is self-aligned, will expose the tapered portion of the fin. The bottom source/drain region is grown on the tapered portion of the fin, so that the bottom extension under the bottom spacer is more uniform. Using consolidated RIE (e.g., combined fin and bottom source/drain recess) the taper profile of the fin is "absorbed" by the bottom source/drain epitaxial growth and has less effect on the bottom source/drain region.

FIG. 17 shows a side cross-sectional view 1700 of a fin 1702' formed from a substrate 1702. The fin 1702' has a hard mask layer 1703 patterned over a top surface thereof. The substrate 1702, fin 1702' and hard mask layer 1703 may be formed of similar materials and with similar sizing as the substrate 402, fin 402' and hard mask layer 503 described above. The FIG. 17 structure is shown after the consolidated RIE (e.g., the combined fin plus bottom source/drain etching).

FIG. 18 shows a side cross-sectional view 1800 of the FIG. 17 structure following formation of spacer 1705 and epitaxial growth of bottom source/drain region 1706. The spacer 1705 may initially be formed over the entire structure, with a directional or anisotropic etch being used to remove the portions of the spacer formed on the top surface of the substrate 1702, the top surface of the hard mask layer 1703, and on the tapered portion of the sidewalls of the fin 1702'. The spacer 1705 may be formed of similar materials and with similar sizing as that of the spacer 505 described above.

The bottom source/drain region 1706 has a vertical thickness (in direction Y-Y') that matches or is taller than a vertical thickness of the tapered portion of the fin 1702', such as a thickness in the range of 10 to 40 nm.

The FIG. 18 structure, as compared to the structures of FIGS. 4-10, does not include the oxide layer 404/504 formed over the top surface of the substrate below the bottom source/drain region.

FIG. 19 shows a side cross-sectional view 1900 of the FIG. 18 structure following formation of a bottom spacer 1708 over the bottom source/drain region 1706. The spacer 1705 is removed, followed by formation of the bottom spacer 1708. The bottom spacer 1708 wraps around the fin 1702' as shown. The fin 1702' "behind" the bottom spacer 1708 is shown in dashed outline 1901. The bottom spacer 1708 may be formed of similar materials and with similar sizing as that of the bottom spacer 408 described above. A dielectric layer 1710 is formed over the structure as illustrated. The dielectric layer 1710 may be formed of similar materials and with similar sizing as that of the dielectric layer 410 described above.

Figure 20:
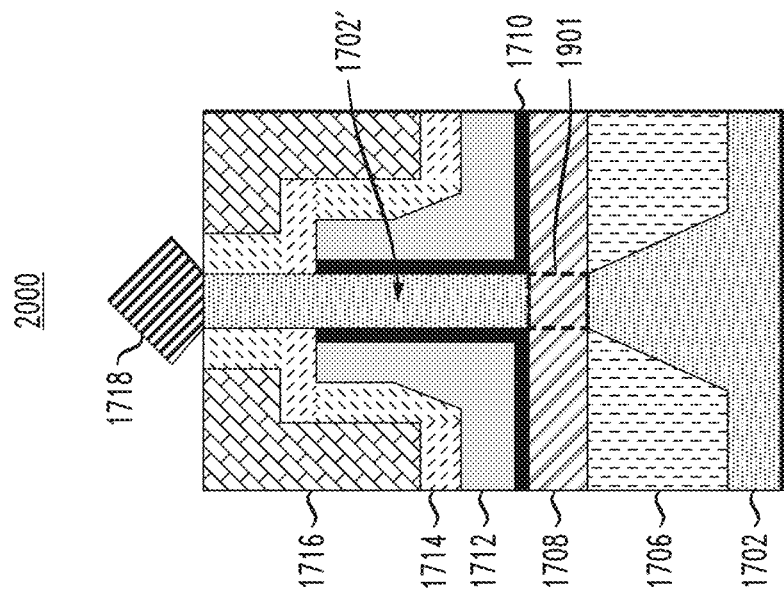
FIG. 20 depicts a side cross-sectional view of the FIG. 19 structure following additional processing to form a vertical field-effect transistor, according to an embodiment of the present invention.

The structure of FIG. 19 may be subject to various further processing to form a vertical FET as shown in the side cross-sectional view 2000 of FIG. 20. Such additional processing includes etching back the dielectric 1710 to expose a portion of the sidewalls of the fin 1702', formation of layers 1712, 1714 and 1716, and removal of the hard mask 1703 followed by formation of top source/drain region 1718. The layers 1712, 1714, 1716 and top source/drain region 1718 may be formed of similar materials and with similar sizing as layers 412, 414, 416 and top source/drain region 418 described above.

In some embodiments, a method of forming a semiconductor structure comprises forming at least one fin disposed over a substrate, wherein sidewalls of the at least one fin comprises a first portion proximate a top surface of the substrate having a tapered profile and a second portion disposed above the first portion. The method also comprises forming a bottom source/drain region surrounding at least part of the first portion of the sidewalls of the at least one fin having the tapered profile and forming a bottom spacer disposed over a top surface of the bottom source/drain region surrounding at least part of the second portion of the sidewalls of the at least one fin. The at least one fin comprises a channel for a vertical field-effect transistor.

The method may further include forming an oxide layer disposed over the top surface of the substrate surrounding at least part of the first portion of the sidewalls of the at least one fin having the tapered profile, the bottom source/drain region being disposed over a top surface of the oxide layer. Forming the fin may comprise patterning a hard mask layer over a portion of the substrate and etching portions of the substrate exposed by the hard mask layer to form the at least one fin. Forming the oxide layer may comprise filling an oxide over the top surface of the substrate, planarizing the oxide with a top surface of the hard mask layer, and recessing the oxide to reveal at least part of the first portion of the sidewalls of the at least one fin having the tapered profile. The method may further include depositing a spacer over the oxide, the hard mask layer and exposed sidewalls of the at least one fin, and etching the spacer to remove portions of the spacer disposed on the top surface of the hard mask layer and the oxide and to leave portions of the spacer disposed on sidewalls of the hard mask layer and on the second portion of the sidewalls of the at least one fin. The method may further include recessing the remaining oxide to form the oxide layer and forming the bottom source/drain region on the top surface of the oxide layer.

The bottom source/drain region may be disposed over the top surface of the substrate. Forming the at least one fin may comprise patterning a hard mask layer over a portion of the substrate and etching portions of the substrate exposed by the hard mask layer to form the at least one fin. Forming the oxide layer may comprise depositing a spacer over the top surface of the substrate, the hard mask layer and sidewalls of the at least one fin and etching the spacer to remove portions of the spacer disposed on the top surface of the hard mask layer and the top surface of the substrate and to leave portions of the spacer disposed on the sidewalls of the hard mask layer and on the second portion of the sidewalls of the at least one fin. The method may further comprise forming the bottom source/drain region on the top surface of the substrate surrounding the first portion of the sidewalls of the at least one fin exposed by etching the spacer.

In some embodiments, a semiconductor structure comprises a substrate, at least one fin disposed on a top surface of the substrate, wherein sidewalls of the at least one fin comprises a first portion proximate a top surface of the substrate having a tapered profile and a second portion disposed above the first portion, a bottom source/drain region surrounding at least part of the first portion of the sidewalls of the at least one fin having the tapered profile, and a bottom spacer disposed over a top surface of the bottom source/drain region surrounding at least part of the second portion of the sidewalls of the at least one fin. The at least one fin comprises a channel for a vertical field-effect transistor.

The semiconductor structure may further comprise an oxide layer disposed over the top surface of the substrate surrounding at least part of the first portion of the sidewalls of the at least one fin having the tapered profile, the bottom source/drain region being disposed over a top surface of the oxide layer. Alternatively, the bottom source/drain region may be disposed over the top surface of the substrate.

The semiconductor structure may further comprise a dielectric layer disposed over a top surface of the bottom spacer and surrounding at least part of the second portion of the sidewalls of the at least one fin, a gate conductor disposed over the dielectric layer, an additional dielectric layer disposed over the gate conductor and surrounding at least part of the second portion of the sidewalls of the at least one fin disposed above the dielectric layer, and a top source/drain region disposed over a top surface of the at least one fin.

In some embodiments, an integrated circuit comprises a vertical field-effect transistor comprising a substrate, at least one fin disposed on a top surface of the substrate, wherein sidewalls of the at least one fin comprises a first portion proximate a top surface of the substrate having a tapered profile and a second portion disposed above the first portion, a bottom source/drain region surrounding at least part of the first portion of the sidewalls of the at least one fin having the tapered profile, and a bottom spacer disposed over a top surface of the bottom source/drain region surrounding at least part of the second portion of the sidewalls of the at least one fin. The at least one fin provides a channel for the vertical field-effect transistor.

The vertical field-effect transistor may further comprise an oxide layer disposed over the top surface of the substrate surrounding at least part of the first portion of the sidewalls of the at least one fin having the tapered profile, the bottom source/drain region being disposed over a top surface of the oxide layer. Alternatively, the bottom source/drain region may be disposed over the top surface of the substrate.

In the description above, various materials and dimensions for different elements are provided. Unless otherwise noted, such materials are given by way of example only and embodiments are not limited solely to the specific examples given. Similarly, unless otherwise noted, all dimensions are given by way of example and embodiments are not limited solely to the specific dimensions or ranges given.

Semiconductor devices and methods for forming same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, complementary metal-oxide-semiconductors (CMOSs), metal-oxide-semiconductor field-effect transistors (MOSFETs), and/or fin field-effect transistors (FinFETs). By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
   a substrate;
   at least one fin disposed on a top surface of the substrate, wherein sidewalls of the at least one fin comprises a first portion proximate a top surface of the substrate having a tapered profile and a second portion disposed above the first portion having a straight profile;
   a bottom source/drain region surrounding the first portion of the sidewalls of the at least one fin having the tapered profile; and
   a bottom spacer disposed over a top surface of the bottom source/drain region, the bottom spacer surrounding at least part of the second portion of the sidewalls of the at least one fin having the straight profile, the bottom spacer not surrounding any portion of the first portion of the sidewalls of the at least one fin having the tapered profile;
   wherein the at least one fin comprises a channel for a vertical field-effect transistor.

2. The semiconductor structure of claim 1, further comprising an oxide layer disposed over the top surface of the substrate surrounding at least part of the first portion of the sidewalls of the at least one fin having the tapered profile, the bottom source/drain region being disposed over a top surface of the oxide layer.

3. The semiconductor structure of claim 1, wherein the bottom source/drain region is disposed over the top surface of the substrate.

4. The semiconductor structure of claim 1, further comprising a dielectric layer disposed over a top surface of the bottom spacer and surrounding at least part of the second portion of the sidewalls of the at least one fin.

5. The semiconductor structure of claim 4, further comprising a gate conductor disposed over the dielectric layer.

6. The semiconductor structure of claim 5, further comprising a gate encapsulation layer disposed over the gate conductor and surrounding at least part of the second portion of the sidewalls of the at least one fin disposed above the dielectric layer.

7. The semiconductor structure of claim 6, further comprising an insulator layer disposed over the gate encapsulation layer.

8. The semiconductor structure of claim 1, further comprising a top source/drain region disposed over a top surface of the at least one fin.

9. The semiconductor structure of claim 1, wherein the tapered profile of the first portion of the at least one fin comprises a tapering angle between about 30 degrees and about 85 degrees.

10. The semiconductor structure of claim 1, wherein the tapered profile of the first portion of the at least one fin has a height between about 10 nanometers and about 30 nanometers.

11. An integrated circuit comprising:
a vertical field-effect transistor comprising:
  a substrate;
  at least one fin disposed on a top surface of the substrate, wherein sidewalls of the at least one fin comprises a first portion proximate a top surface of the substrate having a tapered profile and a second portion disposed above the first portion having a straight profile;
  a bottom source/drain region surrounding the first portion of the sidewalls of the at least one fin having the tapered profile; and
  a bottom spacer disposed over a top surface of the bottom source/drain region, the bottom spacer surrounding at least part of the second portion of the sidewalls of the at least one fin having the straight profile, the bottom spacer not surrounding any portion of the first portion of the sidewalls of the at least one fin having the tapered profile;
  wherein the at least one fin provides a channel for the vertical field-effect transistor.

12. The integrated circuit of claim 11, wherein the vertical field-effect transistor further comprises an oxide layer disposed over the top surface of the substrate surrounding at least part of the first portion of the sidewalls of the at least one fin having the tapered profile, the bottom source/drain region being disposed over a top surface of the oxide layer.

13. The integrated circuit of claim 11, wherein the bottom source/drain region is disposed over the top surface of the substrate.

14. The integrated circuit of claim 11, further comprising a dielectric layer disposed over a top surface of the bottom spacer and surrounding at least part of the second portion of the sidewalls of the at least one fin.

15. The integrated circuit of claim 14, further comprising a gate conductor disposed over the dielectric layer.

16. The integrated circuit of claim 15, further comprising a gate dielectric layer disposed over the gate conductor and surrounding at least part of the second portion of the sidewalls of the at least one fin disposed above the dielectric layer.

17. The semiconductor structure of claim 16, further comprising an insulator layer disposed over the gate encapsulation layer.

18. The integrated circuit of claim 11, further comprising a top source/drain region disposed over a top surface of the at least one fin.

19. The integrated circuit of claim 11, wherein the tapered profile of the first portion of the at least one fin comprises a tapering angle between about 30 degrees and about 85 degrees.

20. The integrated circuit of claim 11, wherein the tapered profile of the first portion of the at least one fin has a height between about 10 nanometers and about 30 nanometers.

* * * * *